United States Patent
Gaynes et al.

(10) Patent No.: US 8,411,444 B2
(45) Date of Patent: Apr. 2, 2013

(54) THERMAL INTERFACE MATERIAL APPLICATION FOR INTEGRATED CIRCUIT COOLING

(75) Inventors: Michael Anthony Gaynes, Vestal, NY (US); Dong Gun Kam, White Plains, NY (US); Duixian Liu, Scarsdale, NY (US); Scott Kevin Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 12/882,362

(22) Filed: Sep. 15, 2010

(65) Prior Publication Data

US 2012/0063094 A1    Mar. 15, 2012

(51) Int. Cl.
*H05K 7/20* (2006.01)
*H05K 9/00* (2006.01)

(52) U.S. Cl. ........ 361/720; 361/719; 361/704; 174/252; 174/260; 257/707; 257/712

(58) Field of Classification Search ............. 361/679.46, 361/679.53, 704–712, 715, 719–722, 737, 361/752, 760–767, 800, 816, 818; 165/80.3, 165/80.4, 104.33, 185; 174/15.2, 16.3, 252–267; 257/686, 690, 698, 706–727, 777, 786, 692, 257/774; 29/825–852; 438/106–118, 122
See application file for complete search history.

(56) References Cited

U.S. PATENT DOCUMENTS

| | | | | |
|---|---|---|---|---|
| 5,640,048 A * | 6/1997 | Selna | ............................ | 257/738 |
| 5,708,566 A * | 1/1998 | Hunninghaus et al. | ....... | 361/704 |
| 5,952,719 A * | 9/1999 | Robinson et al. | ............. | 257/737 |
| 6,163,458 A * | 12/2000 | Li | .................................. | 361/704 |
| 6,282,095 B1 | 8/2001 | Houghton et al. | | |
| 6,359,341 B1 * | 3/2002 | Huang et al. | .................. | 257/778 |
| 6,525,942 B2 * | 2/2003 | Huang et al. | .................. | 361/704 |
| 6,556,169 B1 * | 4/2003 | Fukuura et al. | ........ | 343/700 MS |
| 6,582,979 B2 * | 6/2003 | Coccioli et al. | ................. | 438/25 |
| 6,747,362 B2 | 6/2004 | Barrow | | |
| 6,924,407 B2 * | 8/2005 | Subramaniam et al. | ........ | 585/20 |
| 7,037,755 B2 | 5/2006 | Enquist | | |
| 7,227,256 B2 * | 6/2007 | Zhao et al. | .................... | 257/707 |
| 7,247,516 B1 * | 7/2007 | Hashemi et al. | ............. | 438/106 |
| 7,268,013 B2 * | 9/2007 | Brooks et al. | ................. | 438/106 |
| 7,269,017 B2 * | 9/2007 | Berlin et al. | ................. | 361/719 |
| 7,289,008 B2 * | 10/2007 | Kuroki et al. | ................. | 333/133 |
| 7,538,424 B2 * | 5/2009 | Mullen et al. | ................. | 257/712 |
| 7,606,038 B2 * | 10/2009 | Sugimura | ..................... | 361/720 |
| 7,612,445 B2 * | 11/2009 | Murai et al. | .................. | 257/696 |
| 7,615,856 B2 | 11/2009 | Sakai et al. | | |
| 7,656,030 B2 | 2/2010 | Osone et al. | | |
| 7,675,465 B2 | 3/2010 | Doan et al. | | |
| 8,021,927 B2 * | 9/2011 | Khan et al. | .................... | 438/122 |
| 2002/0036345 A1 * | 3/2002 | Iseki et al. | .................... | 257/734 |
| 2007/0252249 A1 * | 11/2007 | Murai et al. | ................... | 257/666 |
| 2009/0166072 A1 * | 7/2009 | Fuji et al. | ...................... | 174/260 |
| 2009/0322643 A1 | 12/2009 | Choudhury | | |

\* cited by examiner

*Primary Examiner* — Michail V Datskovskiy
(74) *Attorney, Agent, or Firm* — Anne V. Dougherty; Ryan, Mason & Lewis, LLP

(57) ABSTRACT

Techniques provide improved thermal interface material application in an assembly associated with an integrated circuit package. For example, an apparatus comprises an integrated circuit module, a printed circuit board, and a heat transfer device. The integrated circuit module is mounted on a first surface of the printed circuit board. The printed circuit board has at least one thermal interface material application via formed therein in alignment with the integrated circuit module. The heat transfer device is mounted on a second surface of the printed circuit board and is thermally coupled to the integrated circuit module. The second surface of the printed circuit board is opposite to the first surface of the printed circuit board.

14 Claims, 5 Drawing Sheets

THERMAL INTERFACE MATERIAL APPLICATION FOR INTEGRATED CIRCUIT COOLING

FIELD OF THE INVENTION

The present invention relates generally to integrated circuit package cooling and, more particularly, to techniques for providing improved thermal interface material application in an assembly including an integrated circuit package.

BACKGROUND OF THE INVENTION

In today's portable electronic devices, there are typically one or more radio frequency (RF) modules that serve to provide wireless data exchange between the device and its operating environment. Such an RF module requires one or more antennas to transmit/receive data signals. The RF module and antennas are mounted in some manner on a printed circuit board (PCB).

Until recently, the one or more antennas have been designed independently as a printed shape on the (PCB) or as an individual component to be assembled near an RF integrated circuit (RFIC) die. However, the assembly of the individual antenna or antennas on the board is problematic in the context of mass production.

Recently, it has become popular to integrate the one or more antennas into the RF module. It is understandable that the integration of the one or more antennas into the module brings a huge advantage in terms of cost and performance. However, cooling becomes very challenging since cooling devices used to transfer heat away from the RF module, such as heat sinks and heat spreaders, should be mounted so as not to electromagnetically interfere with the signal transmission/reception of the one or more antennas.

To address this interference problem, cavity-down type integrated circuit packages have been proposed. In such a package, the antenna-embedded package has a cavity formed on its bottom surface in which the RFIC die is mounted. This cavity-down type integrated circuit package is mounted on a top surface of the PCB with a heat sink or heat spreader mounted below the PCB. This way, the heat sink or heat spreader does not electromagnetically interfere with the signal transmission/reception of the one or more antennas. However, there must be some type of heat transfer mechanism/medium employed between the components to effectively transfer heat away from the RFIC die.

SUMMARY OF THE INVENTION

Techniques provide improved thermal interface material application in an assembly including an integrated circuit package.

For example, in a first aspect of the invention, an apparatus comprises an integrated circuit module, a printed circuit board, and a heat transfer device. The integrated circuit module is mounted on a first surface of the printed circuit board. The printed circuit board has at least one thermal interface material application via formed therein in alignment with the integrated circuit module. The heat transfer device is mounted on a second surface of the printed circuit board and is thermally coupled to the integrated circuit module. The second surface of the printed circuit board is opposite to the first surface of the printed circuit board.

In one embodiment, the integrated circuit module comprises at least one radio frequency integrated circuit (RFIC) die and at least one embedded antenna package. The at least one RFIC die and the at least one embedded antenna package may be electrically coupled via a flip-chip type connection or via a wire-bond type connection. Further, the at least one embedded antenna package may comprise a substrate and at least one antenna embedded in the substrate. The substrate may comprise an organic material or a ceramic material. The at least one embedded antenna package may comprise a surface mounting feature for mounting to the first surface of the printed circuit board, wherein the surface mounting feature of the substrate is one of a ball grid array, a land grid array, and a quad flat package. Still further, the integrated circuit module may be a cavity-down type integrated circuit package.

In a second aspect of the invention, an antenna assembly comprises an antenna package, a printed circuit board, and a heat transfer device. The antenna package is mounted on a first surface of the printed circuit board. The printed circuit board has at least one thermal interface material application via formed therein in alignment with the antenna package. The heat transfer device is mounted on a second surface of the printed circuit board and is thermally coupled to the antenna package. The second surface of the printed circuit board is opposite to the first surface of the printed circuit board. In one embodiment, the antenna package is a millimeter wave antenna package.

In a third aspect of the invention, a method comprises the following steps. At least one thermal interface material application via is formed in a printed circuit board. An integrated circuit module is mounted on the printed circuit board. The integrated circuit module is mounted on a first surface of the printed circuit board in alignment with the at least one thermal interface material application via formed therein. A heat transfer device is mounted on a second surface of the printed circuit board in alignment with the at least one thermal interface material application via formed therein. The second surface of the printed circuit board is opposite to the first surface of the printed circuit board.

In one embodiment, the method further comprises applying a thermal interface material through the at least one thermal interface material application via formed in the printed circuit board prior to mounting the heat transfer device on a second surface of the printed circuit board. The thermal interface material may be applied through the at least one thermal interface material application by injecting the thermal interface material through the at least one thermal interface material application via. Further, the thermal interface material may be applied through the at least one thermal interface material application via formed in the printed circuit board after one or more components are surface-mounted on the printed circuit board. The one or more components may be surface-mounted on the printed circuit board via a reflow soldering process.

In a fourth aspect of the invention, a method comprises the following steps. At least one non-plated through via is formed in a printed circuit board. An integrated circuit module is mounted on the printed circuit board. The integrated circuit module is mounted on a first surface of the printed circuit board in alignment with the at least one non-plated through via formed therein. One or more components are mounted on the printed circuit board via a reflow soldering process. A thermal interface material is injected through the at least one non-plated through via. A heat transfer device is mounted on a second surface of the printed circuit board in alignment with the at least one non-plated through via formed therein. The second surface of the printed circuit board is opposite to the first surface of the printed circuit board.

Advantageously, the above-described techniques provide for improved application of thermal interface material in an integrated circuit package assembly such that the thermal interface material is not degraded or otherwise compromised by other assembly steps. For example, illustrative embodiments of the invention provide efficient cooling paths within an RF module between a cooling device (heat transfer device) and an RFIC. With the inventive fabrication and structural arrangements, the efficiency of heat removal is greatly improved.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

Principles of the present invention will be described herein in the context of illustrative integrated circuit packages such as a cavity-down type integrated circuit package and illustrative integrated circuit dies such as a radio frequency integrated circuit (RFIC) die. However, it is to be appreciated that the principles of the present invention are not limited to any particular package type or IC die. Rather, the principles of the invention are directed broadly to techniques for improved thermal interface material application in the fabrication process of a printed circuit board assembly that includes an integrated circuit package and a heat transfer device. While principles of the invention are not limited to any particular package or die types, they are well-suited for use in millimeter (mm) wave antenna assemblies.

As will be illustratively described herein, in the context of various illustrative embodiments, principles of the invention provide techniques that provide efficient dissipation of heat generated by a semiconductor die such as an RFIC die.

Recall, as mentioned above, that when one or more antennas are integrated into an RFIC package, such as a cavity-down type integrated circuit package, cooling becomes very challenging since heat transfer devices used to transfer heat away from the RF module, such as heat sinks and heat spreaders, should be mounted so as not to electromagnetically interfere with the signal transmission/reception of the one or more antennas.

Figure 1:
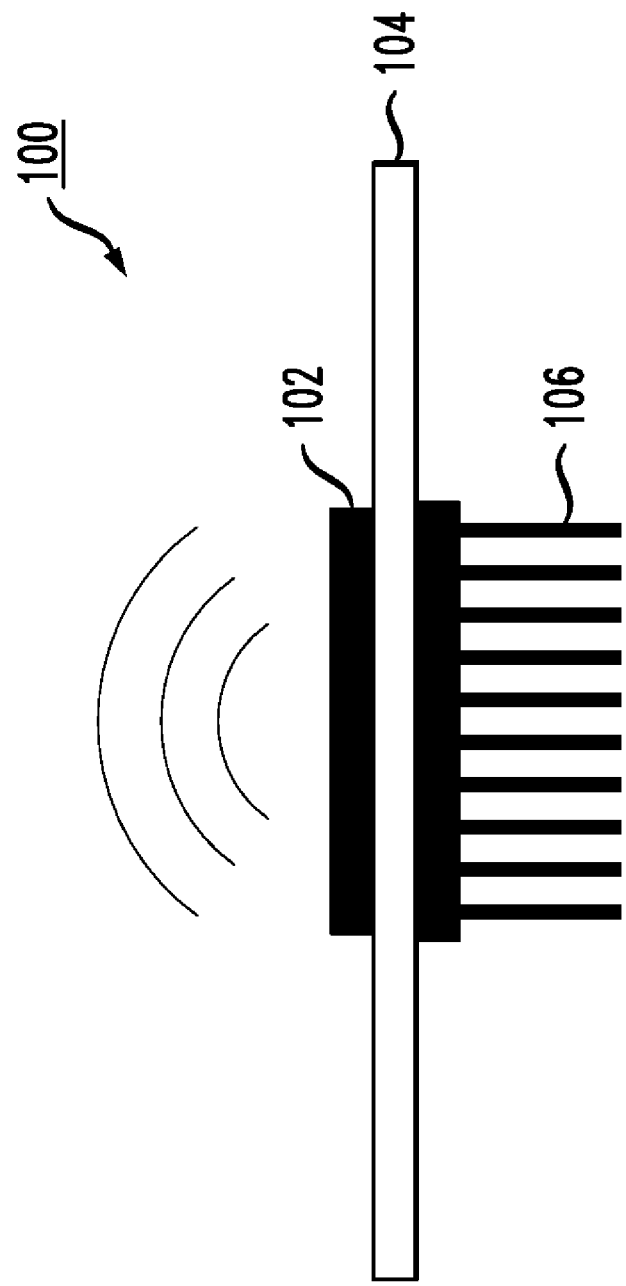
FIG. 1 illustrates an example of a placement on a printed circuit board of a heat transfer device with respect to an integrated circuit package, in accordance with one embodiment of the invention.

FIG. 1 illustrates an example of a placement of components on a printed circuit board that accomplishes a goal of eliminating electromagnetic interference caused by the heat transfer device.

As shown, the printed circuit board assembly 100 in FIG. 1 comprises an integrated circuit package 102, which could be an RFIC module that has an embedded antenna array (e.g., a mmWave package), mounted on a first (e.g., top) surface of a printed circuit board 104. The assembly 100 also comprises a heat transfer device (heat sink or heat spreader) 106 mounted on a second (e.g., bottom) surface of the printed circuit board 104.

With the heat transfer device 106 mounted on the side of the printed circuit board 104 opposite to the side of the printed circuit board to which the integrated circuit package 102 is mounted, the embedded antenna array in the integrated circuit package 102 is able to transmit/receive signals without experiencing electromagnetic interference due to the heat transfer device 106.

Figure 2:
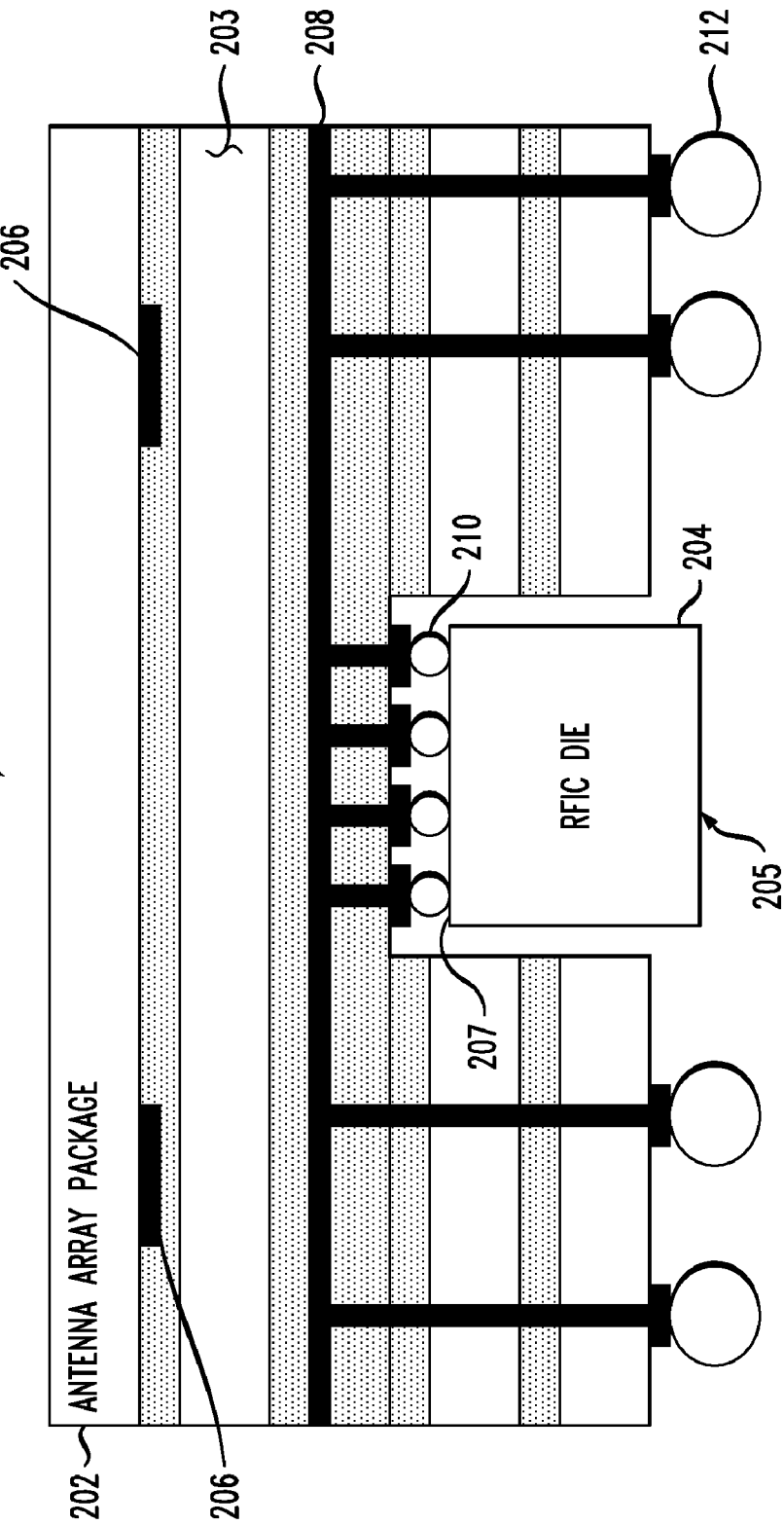
FIG. 2 illustrates a cavity-down type integrated circuit package, in accordance with one embodiment of the invention.

FIG. 2 illustrates an example of a cavity-down type integrated circuit package, in accordance with one embodiment of the invention. The cavity-down type integrated circuit package 200 shown in FIG. 2 is one example of an integrated circuit package 102 (FIG. 1).

As shown, the cavity-down type integrated circuit package 200 comprises an antenna array package 202 and an RFIC die 204. The antenna array package 202 comprises a substrate 203. The substrate 203 can comprise an organic material such as, by way of example only, liquid-crystal polymer, polytetrafluoroethylene, or an FR4 based laminate. Alternatively, the substrate 203 can comprise a ceramic material.

An antenna (or an antenna array with more than one antenna) 206 is embedded at the top part of the substrate 203. The RFIC die 204 and a ball grid array (BGA) 212 (or any other surface mount packages such as land grid array (LGA) and quad flat package (QFP)) are attached to the bottom side of the substrate 203.

In this embodiment, the RFIC die 204 is flip-chip mounted so that the backside 205 of the die is exposed and available for heat removal. A flip-chip type connection is a method for interconnecting semiconductor devices, such as integrated circuit dies, to external circuitry with solder bumps that are deposited onto the chip pads. These solder bumps (210 in FIG. 2) electrically connect with copper pads 208 of the external circuitry, in this case, the antenna array package 202. The copper pads are electrically connected with the one or more antennas 206. The solder bumps 210 are typically deposited on the chip pads on the top side 207 of the die 204 during the final die processing step. Thus, in order to mount the RFIC die 204 to the antenna array package 202, the die is flipped over so that it faces down, and aligned so that its pads align with matching pads on the antenna array package 202, and then the solder is flowed to complete the interconnect.

This is in contrast to wire bonding, in which the chip is mounted upright and wires are used to interconnect the chip pads to external circuitry. Such a wire-bond type connection may alternatively be used to connect the RFIC die 204 and the antenna array package 202.

Figure 3:
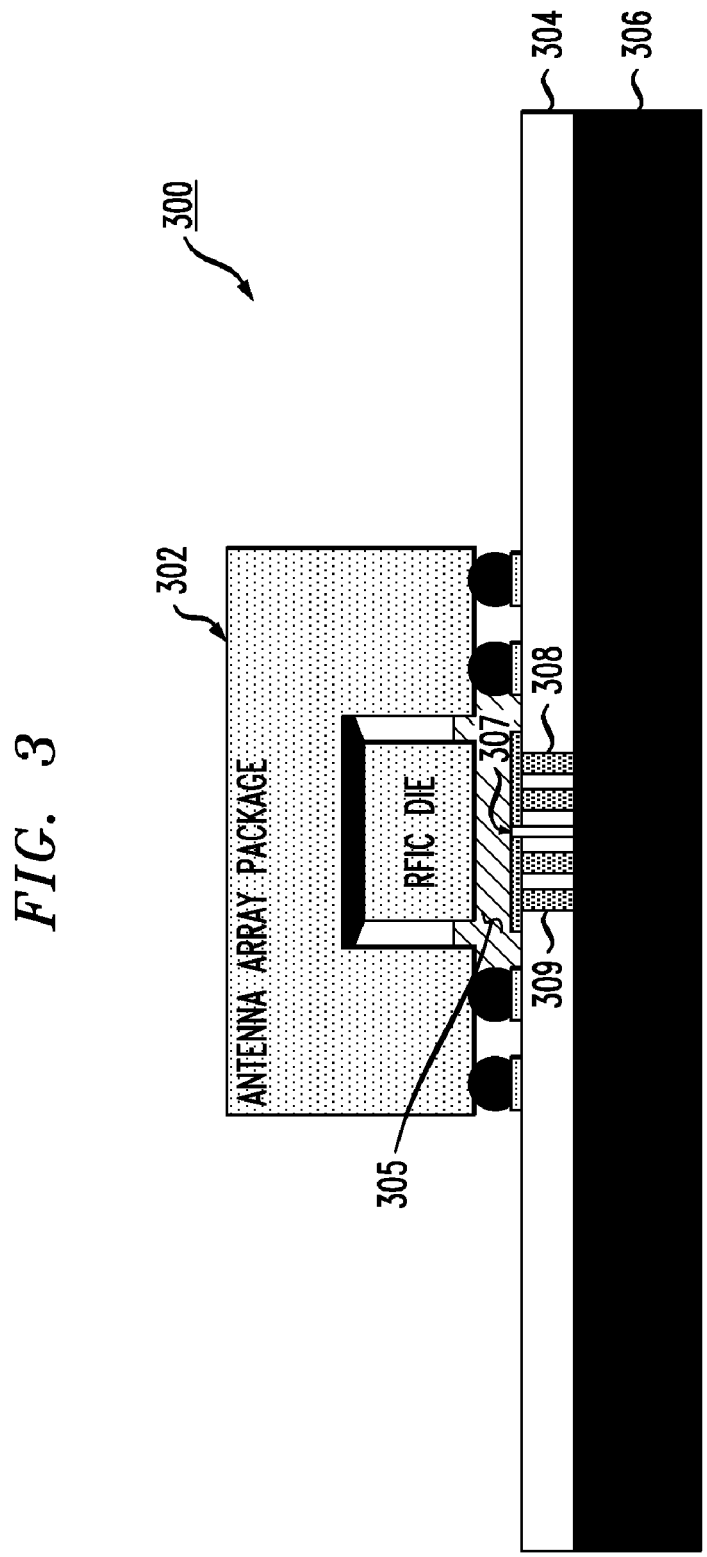
FIG. 3 illustrates a printed circuit board assembly with a cavity-down type integrated circuit package and heat transfer device, in accordance with one embodiment of the invention.

FIG. 3 illustrates a printed circuit board assembly with a cavity-down type integrated circuit package and heat transfer device, in accordance with one embodiment of the invention. The printed circuit board assembly 300 in FIG. 3 comprises a cavity-down type integrated circuit package 302 mounted on a top surface of a printed circuit board 304, and a heat transfer device (cooling device) 306 mounted on the bottom surface of the printed circuit board 304. Note that the cavity-down type integrated circuit package 302 corresponds to the cavity-down type integrated circuit package 200 in FIG. 2.

As shown in FIG. 3, the printed circuit board 304 comprises at least one thermal interface material application via 307 formed in alignment with the integrated circuit package 302 and the heat transfer device 306. While only one via 307 is shown in FIG. 3, it is understood that more than one such via 307 may be formed in the printed circuit board 304. Via 307 is preferably non-plated. The printed circuit board 304 also has one or more plated thermal vias 308 that connect copper pads 309 with the heat transfer device 306. These plated thermal vias 308 are also positioned in alignment with the integrated circuit package 302 and the heat transfer device 306.

Also as shown, a thermal interface material (TIM) 305 is in contact with the RFIC die of the integrated circuit package 302 and the copper pads 309. As will be explained below in the fabrication process of FIGS. 4A through 4E, the TIM 305 is applied by injecting the TIM through the bottom of the thermal interface material application via 307 before the heat transfer device 306 is mounted to the bottom of the printed circuit board 304. Examples of TIM may include, but are not limited to, silicone oil filled with aluminum oxide, zinc oxide, or boron nitride, micronized or pulverized silver, and phase-change materials. TIM is used as a heat transfer medium that allows heat energy to move from the RFIC die to the copper pads 309 and plated thermal vias 308 of the printed circuit board 304 to the heat transfer device 306.

FIGS. 4A through 4E illustrate a method of fabricating the printed circuit board assembly of FIG. 3.

Figure 4A:
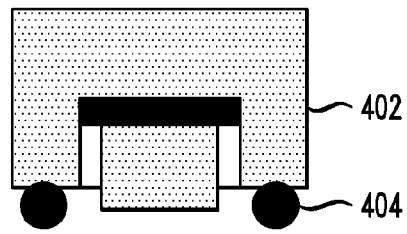
FIGS. 4A through 4E illustrate a method of fabricating the printed circuit board assembly of FIG. 3.

As shown in FIG. 4A, a ball grid array 404 is attached to the bottom of the substrate that is part of the integrated circuit package 402 (i.e., package 302 in FIG. 3). This is referred to as the BGA balling process.

Figure 4B:
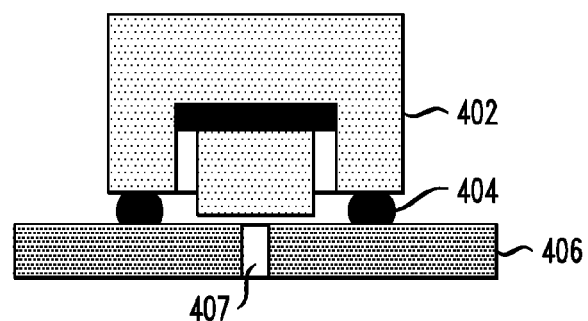

Next, as shown in FIG. 4B, the integrated circuit package 402 is mounted on the top surface of the printed circuit board 406 (i.e., printed circuit board 306) with the thermal interface material application via(s) 407 (i.e., thermal interface material application via(s) 307) formed therein. The integrated circuit package 402 is electrically connected to the printed circuit board 406 by a reflow soldering process, in this case, a BGA reflow. As is known, reflow soldering is a process in which a solder paste, such as an adhesive-like mixture of powdered solder and flux, is used to temporarily attach one or more electrical components to their contact pads, after which the entire assembly is subjected to controlled heat (e.g., reflow oven or some other heat source). The controlled heat melts the solder thereby permanently connecting the joint(s).

Figure 4C:
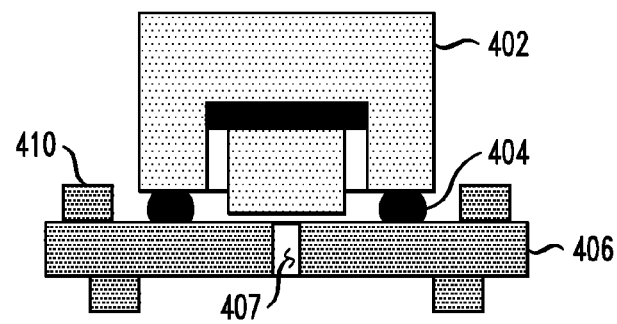

Then, as shown in FIG. 4C, one or more components 410 are surface-mounted to the printed circuit board 406. These components may be other IC chips that are part of the printed circuit board. They are typically surface-mounted using a reflow soldering process (similar to the one described above for BGA reflow), in this case, an SMT (surface mount technology) reflow.

Figure 4D:
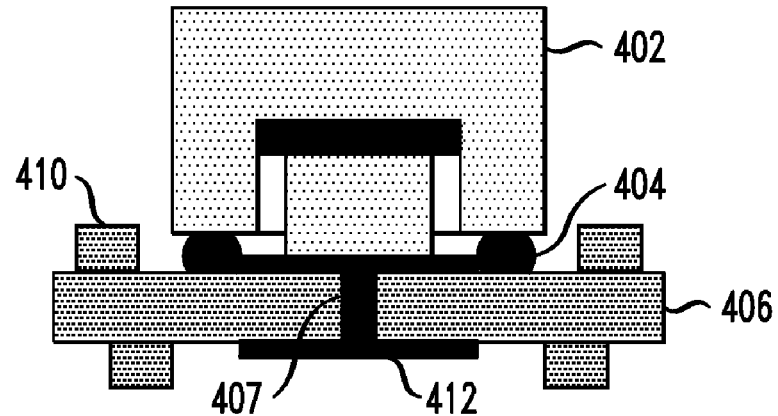
Figure 4E:
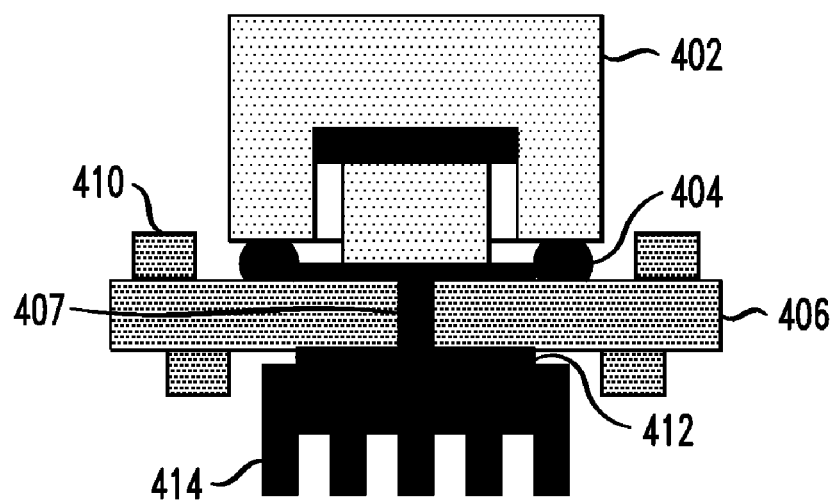

In FIG. 4D, thermal interface material (TIM) 412 (i.e., TIM 305) is injected through the bottom of the thermal interface material application via 407 using a syringe (not shown). The TIM 412 contacts the RFIC die of the integrated circuit package 402 and provides a thermal conduit between the RFIC die and the heat transfer device 414 (i.e., heat transfer device 306), which is then mounted on the bottom surface of the printed circuit board 406, as shown in FIG. 4E. The TIM 412 establishes a low-thermal-resistance interface between the RFIC die and the heat transfer device.

In existing fabrication processes, it is known that the TIM is applied to the RFIC die and the corresponding area of the top surface of the printed circuit board prior to the BGA reflow and the SMT reflow. In such cases, the TIM is exposed to solder reflow conditions several times. We have realized that, when using such an existing fabrication process, the TIM fails to maintain suitable heat transfer properties after exposure to the solder reflow. That is, the TIM becomes degraded and non-stable. As such, with existing fabrication processes, an extensive production qualification test (PQT) is required to confirm TIM stability before going into production.

However, in accordance with principles of the invention as illustrated in FIGS. 4A through 4E, the TIM is applied after the BGA and SMT reflows, which is made possible by the formation of non-plated application via(s) 407 in the printed circuit board 406, thus allowing injection of the TIM after the reflow steps but before attachment of the heat transfer device. Since the TIM can be injected near the very end of the assembly process and need not to be exposed to solder reflow, the time-consuming PQT processes are eliminated.

In one embodiment, the size of BGA balls is chosen to ensure that the combined height of the flip-chip mounted RFIC die is less than the BGA stand-off. In another embodiment, the package substrate has an open cavity to accommodate the RFIC die. In such a case, the die need not be thinned. In yet another embodiment, the printed circuit board can have a recess larger than the size of the die. During the BGA reflow, the die would slip into the recess. Still further, the package substrate and the board substrate can be made of any materials including, but not limited to, FR4, polytetrafluoroethylene, liquid-crystal polymer based laminates or build-up organics, as well as ceramic substrates. Also, principles of the invention can be applied to any cavity-down type packages for any semiconductor die.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus, comprising:
    an integrated circuit module;
    a printed circuit board, the integrated circuit module being mounted on a first surface of the printed circuit board, the printed circuit board having at least one thermal interface material application via formed therein in alignment with the integrated circuit module; and
    a heat transfer device, the heat transfer device being mounted on a second surface of the printed circuit board and being thermally coupled to the integrated circuit module, the second surface of the printed circuit board being opposite to the first surface of the printed circuit board;
    wherein the integrated circuit module comprises at least one radio frequency integrated circuit (RFIC) die and at least one embedded antenna package.

2. The apparatus of claim 1, wherein the at least one RFIC die and the at least one embedded antenna package are electrically coupled via a flip-chip type connection.

3. The apparatus of claim 1, wherein the at least one RFIC die and the at least one embedded antenna package are electrically coupled via a wire-bond type connection.

4. The apparatus of claim 1, wherein the at least one embedded antenna package comprises a substrate and at least one antenna embedded in the substrate.

5. The apparatus of claim 4, wherein the substrate comprise an organic material.

6. The apparatus of claim 5, wherein the organic material comprises one of a liquid-crystal polymer, a polytetrafluoroethylene, and an FR4 based laminate.

7. The apparatus of claim 4, wherein the substrate comprises a ceramic material.

8. The apparatus of claim 4, wherein the at least one embedded antenna package comprises a surface mounting feature for mounting to the first surface of the printed circuit board.

9. The apparatus of claim 8, wherein the surface mounting feature of the substrate comprises one of a ball grid array, a land grid array, and a quad flat package.

10. An apparatus, comprising:
an integrated circuit module;
a printed circuit board, the integrated circuit module being mounted on a first surface of the printed circuit board, the printed circuit board having at least one thermal interface material application via formed therein in alignment with the integrated circuit module; and
a heat transfer device, the heat transfer device being mounted on a second surface of the printed circuit board and being thermally coupled to the integrated circuit module, the second surface of the printed circuit board being opposite to the first surface of the printed circuit board;
wherein the integrated circuit module is a cavity-down type integrated circuit package.

11. An antenna assembly, comprising:
an antenna package;
a printed circuit board, the antenna package being mounted on a first surface of the printed circuit board, the printed circuit board having at least one thermal interface material application via formed therein in alignment with the antenna package; and
a heat transfer device, the heat transfer device being mounted on a second surface of the printed circuit board and being thermally coupled to the antenna package, the second surface of the printed circuit board being opposite to the first surface of the printed circuit board;
wherein the antenna package comprises a radio frequency integrated circuit (RFIC) die and an embedded antenna array package, wherein the RFIC die is flip-chip mounted to the embedded antenna array package.

12. An antenna assembly, comprising:
an antenna package;
a printed circuit board, the antenna package being mounted on a first surface of the printed circuit board, the printed circuit board having at least one thermal interface material application via formed therein in alignment with the antenna package; and
a heat transfer device, the heat transfer device being mounted on a second surface of the printed circuit board and being thermally coupled to the antenna package, the second surface of the printed circuit board being opposite to the first surface of the printed circuit board;
wherein the antenna package comprises a surface mounting feature for mounting to the first surface of the printed circuit board.

13. An antenna assembly, comprising:
an antenna package;
a printed circuit board, the antenna package being mounted on a first surface of the printed circuit board, the printed circuit board having at least one thermal interface material application via formed therein in alignment with the antenna package; and
a heat transfer device, the heat transfer device being mounted on a second surface of the printed circuit board and being thermally coupled to the antenna package, the second surface of the printed circuit board being opposite to the first surface of the printed circuit board;
wherein the antenna package is a millimeter wave antenna package.

14. An antenna assembly, comprising:
an antenna package;
a printed circuit board, the antenna package being mounted on a first surface of the printed circuit board, the printed circuit board having at least one thermal interface material application via formed therein in alignment with the antenna package; and
a heat transfer device, the heat transfer device being mounted on a second surface of the printed circuit board and being thermally coupled to the antenna package, the second surface of the printed circuit board being opposite to the first surface of the printed circuit board;
wherein the antenna package is a cavity-down type integrated circuit package.

* * * * *